United States Patent
Chiou et al.

(10) Patent No.: US 9,433,098 B2
(45) Date of Patent: Aug. 30, 2016

(54) METHOD OF MANUFACTURING A COMBINED CIRCUIT BOARD

(71) Applicant: Mutual-Tek Industries Co., Ltd., Xinzhuang (TW)

(72) Inventors: Shi Yu Chiou, New Taipei (TW); Hsu-Tung Chen, New Taipei (TW)

(73) Assignee: Mutual-Tek Industries Co., Ltd., Taipei County, Xinzhuang (TW)

( * ) Notice: Subject to any disclaimer, the term of this patent is extended or adjusted under 35 U.S.C. 154(b) by 314 days.

(21) Appl. No.: 13/748,341

(22) Filed: Jan. 23, 2013

(65) Prior Publication Data

US 2013/0292050 A1 Nov. 7, 2013

(30) Foreign Application Priority Data

May 4, 2012 (TW) ............................. 101115951 A

(51) Int. Cl.

| | |
|---|---|
| *H05K 3/02* | (2006.01) |
| *H05K 3/46* | (2006.01) |
| *B32B 37/02* | (2006.01) |
| *B32B 37/18* | (2006.01) |
| *B32B 38/10* | (2006.01) |
| *H05K 3/00* | (2006.01) |
| *H05K 1/02* | (2006.01) |

(Continued)

(52) U.S. Cl.
CPC .......... *H05K 3/0064* (2013.01); *H05K 3/4691* (2013.01); *B32B 37/02* (2013.01); *B32B 37/144* (2013.01); *B32B 37/18* (2013.01); *B32B 38/10* (2013.01); *H05K 1/0278* (2013.01); *H05K 3/0052* (2013.01); *H05K 3/365* (2013.01); *H05K 2201/0909* (2013.01); *Y10T 156/1056* (2015.01); *Y10T 225/307* (2015.04); *Y10T 225/321* (2015.04); *Y10T 225/325* (2015.04)

(58) Field of Classification Search
CPC .................... Y10T 156/1056; Y10T 225/325; Y10T 225/321; Y10T 225/307; H05K 3/4691; H05K 3/369; H05K 3/365; H05K 2203/1446; H05K 2203/0221; H05K 2203/302; H05K 2201/0129; H05K 2201/058; B32B 38/10
See application file for complete search history.

(56) References Cited

U.S. PATENT DOCUMENTS

| | | | |
|---|---|---|---|
| 5,004,639 A * | 4/1991 | Desai | 428/138 |
| 5,206,463 A * | 4/1993 | DeMaso et al. | 174/254 |
| 2007/0012475 A1* | 1/2007 | Kawaguchi et al. | 174/255 |

(Continued)

FOREIGN PATENT DOCUMENTS

| | | |
|---|---|---|
| CN | 1812658 A | 8/2006 |
| CN | 201528472 U | 7/2010 |

(Continued)

*Primary Examiner* — Linda L Gray
(74) *Attorney, Agent, or Firm* — Snell & Wilmer L.L.P.

(57) ABSTRACT

A method of manufacturing a combined circuit board includes the following steps. First, through portions (TPs) arranged in a predetermined format are formed in a rigid substrate (RS) such that the RS is divided into a predetermined removed region (PRR1) and a predetermined reserved region (PRR2) according to the arrangement of the TPs. Next, a conductive bonding layer (CBL) and a flexible circuit board (FCB) are respectively laminated on two opposite sides of the RS and part of a dielectric bonding layer of the CBL fills the TPs. Next, the RS, the FCB and the CBL are bent according to the TPs such that the PRR2 is bent at the TPs relative to the PRR1. Finally, part of the RS located at the PRR1 and part of the CBL corresponding to the PRR1 are removed to form an indentation to expose part of the FCB.

7 Claims, 10 Drawing Sheets

(51) Int. Cl.
*H05K 3/36* (2006.01)
*B32B 37/14* (2006.01)

(56) References Cited

U.S. PATENT DOCUMENTS

2008/0156437 A1* 7/2008 Kawate et al. ............... 156/330
2012/0187078 A1* 7/2012 Yeh et al. ...................... 216/20
2014/0008110 A1* 1/2014 Arnold et al. ................ 174/257

FOREIGN PATENT DOCUMENTS

| CN | 101896037 A | 11/2010 | |
|----|----|----|----|
| EP | 0126856 A2 * | 12/1984 | ............... H05K 3/00 |
| EP | 1951016 * | 7/2008 | ............... H05K 3/46 |
| TW | 200612792 | 4/2006 | |
| TW | 200938041 A | 9/2009 | |
| TW | 200945868 A | 11/2009 | |

* cited by examiner

METHOD OF MANUFACTURING A COMBINED CIRCUIT BOARD

CROSS REFERENCE TO RELATED APPLICATIONS

This application claims the right of priority based on Taiwan Patent Application No. 101115951 entitled "METHOD OF MANUFACTURING A COMBINED CIRCUIT BOARD" filed on May 4, 2012, which is incorporated herein by reference and assigned to the assignee herein.

FIELD OF THE INVENTION

The present invention is related to a method of manufacturing a circuit board and particularly related to a method of manufacturing a combined circuit board.

BACKGROUND OF THE INVENTION

In general, a conventional circuit board for carrying and electrically connecting a plurality of electronic components substantially comprises circuit layers and dielectric layers that are stacked alternately. Each of the circuit layers are defined and formed by performing a patterning process on a conductive layer. Each of the dielectric layers is disposed between adjacent ones of the circuit layers for spacing apart the circuit layers. In addition, each of the stacked circuit layers may he electrically connected to another by a conductive via. Furthermore, various electronic components (such as active components or passive components) can be disposed on a surface of the circuit board, and electrical signal propagation is achieved by means of an internal circuit of the circuit board.

Due to miniaturization of many electronic products, the application of circuit boards rapidly increases; for example, circuit boards can be applied in flip phones and notebook computers. Hence, it is necessary to develop a combined circuit board combining a flexible circuit board and a rigid circuit board.

SUMMARY OF THE INVENTION

The present invention provides a method of manufacturing a combined circuit board by means of which the yield of manufacturing the combined circuit board is relatively high.

The present invention provides a method of manufacturing a combined circuit board comprising the following steps. First, a rigid substrate comprising a rigid dielectric layer is provided. Next, a plurality of through portions are formed in the rigid dielectric layer. The through portions are arranged in a predetermined format and pass through the rigid dielectric layer such that the rigid substrate is divided into at least one predetermined removed region and at least one predetermined reserved region according to the arrangement of the through portions. Next, a conductive bonding layer is provided. The conductive bonding layer comprises a conductive layer and a dielectric bonding layer disposed on the conductive layer.

Afterward, the conductive bonding layer is laminated on the rigid substrate such that a portion of the dielectric bonding layer is disposed between the conductive layer and the rigid substrate, and another portion of the dielectric bonding layer fills the through portions. Then, a flexible circuit board is laminated on the rigid substrate such that the flexible circuit board and the conductive layer are disposed on two opposite sides of the rigid substrate, respectively. Then, the conductive layer is patterned to form a circuit layer.

Afterward, the rigid substrate, the flexible circuit board, and the conductive bonding layer are bent according to the through portions such that the predetermined reserved region is bent at the through portions relative to the predetermined removed region. Finally, a portion of the rigid substrate located at the predetermined removed region and a portion of the conductive bonding layer corresponding to the predetermined removed region are removed to form an indentation to expose a portion of the flexible circuit board.

In an embodiment of the present invention, before the step of bending the rigid substrate, the flexible circuit board, and the conductive bonding layer, the method of manufacturing a combined circuit board further comprises forming a solder mask layer at least partially covering the circuit layer.

In an embodiment of the present invention, the step of laminating the flexible circuit board on the rigid substrate is performed by laminating the flexible circuit board on the rigid substrate by means of a bonding sheet such that the bonding sheet is bonded to the flexible circuit board and the rigid substrate and located between the flexible circuit board and the rigid substrate. The bonding sheet has at least one through region. The through region is corresponding to the predetermined removed region.

In an embodiment of the present invention, the through portions are formed through laser processing.

In an embodiment of the present invention, the through portions are formed through another physical or chemical processing such as punching, drilling, etc.

In an embodiment of the present invention, the conductive bonding layer is a resin-coated copper.

in an embodiment of the present invention, the material of the rigid dielectric layer comprises fiberglass and resin.

In the present invention, the rigid substrate, the flexible circuit hoard, and the conductive bonding layer are bent according to the through portions filled with the dielectric bonding layer, and a portion of the rigid substrate located at the predetermined removed region and a portion of the conductive bonding layer corresponding to the predetermined removed region are removed to form the indentation. Therefore, in the method of manufacturing a combined circuit board according to the present invention, any unanticipated damage to the flexible circuit board can be prevented during the formation of the indentation. Accordingly, the yield of manufacturing the combined circuit board by means of the method of the present invention is relatively high.

To render the aforesaid features and advantages of the present invention obvious and comprehensible, the present invention is hereunder illustrated with specific embodiments in conjunction with the accompanying drawings.

BRIEF DESCRIPTION OF THE DRAWINGS

FIG. 1A through FIG. 1I are schematic views showing a method of manufacturing a combined circuit board according to an embodiment of the present invention.

DETAILED DESCRIPTION OF THE INVENTION

Figure 1A:
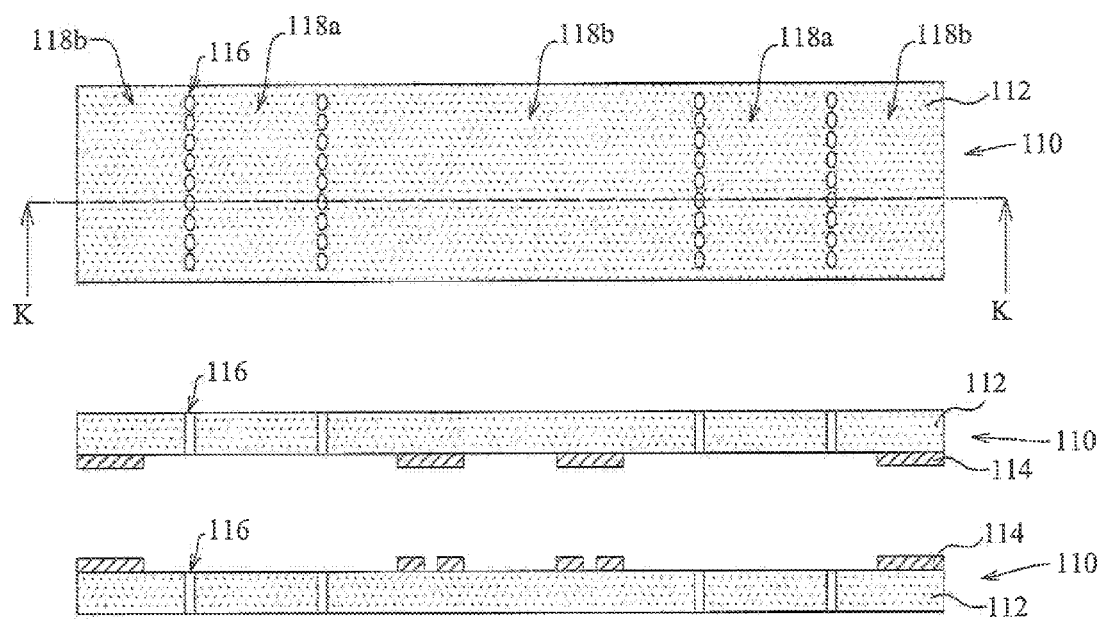

The preferred embodiments of the present invention will now be described in greater detail by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention, Any devices, components, materials, and steps described in the embodiments are only for illustration and not intended to limit the scope of the present invention.

FIG. 1A through FIG. 1I are schematic views showing a method of manufacturing a combined circuit board according to an embodiment of the present invention. In this embodiment, a method of manufacturing a combined circuit board comprises the following steps. First, referring to FIG. 1A, at least one rigid substrate 110 is provided. In this embodiment, for example, two rigid substrates 110 are provided. It should be stated that, for the sake of the following clear description, FIG. 1A shows a top view of one of the rigid substrates 110 and a cross-sectional schematic view thereof taken along the line K-K, and a cross-sectional schematic view of the other of the rigid substrates 110.

Each of the rigid substrates 110 comprises a rigid dielectric layer 112 and a circuit layer 114. For example, each of the rigid dielectric layers 112 comprises fiberglass and resin. The material of each of the rigid dielectric layers 112 may be a composite material made up of bismaleimide-triazine resin (BT resin) and fiberglass, or another composite material made up of epoxy resin and fiberglass, such as FR-4, FR-5. It should be noted that the rigidity of each of the rigid dielectric layers 112 comprising fiberglass and resin is relatively high.

In this embodiment, each of the rigid substrates 110 may be formed by means of processing a copper clad laminate (not shown). For example, the copper clad laminate has two copper foil layers disposed on two opposite sides of a rigid dielectric layer of the copper clad laminate, respectively. In this embodiment, one of the copper foil layers of the copper clad laminate is removed completely and the other one of the copper foil layers of the copper clad laminate is patterned to form the circuit layer 114 such that one of the rigid substrates 110 is formed. In another embodiment, according to the manufacturer's requirement, one of the rigid substrates 110 only has the rigid dielectric layer 112 without the circuit layer 114.

Afterward, a plurality of through portions 116 are formed in the rigid dielectric layer 112 of each of the rigid substrates 110 by means of physical or chemical processing (such as laser processing, punching, drilling, etc.). In this embodiment, for example, the through portions 116 are elliptical through holes. The through portions 116 of each of the rigid substrates 110 are arranged in a predetermined format and pass through the corresponding rigid dielectric layer 112 such that each of the rigid substrates 110 is divided into at least one predetermined removed region 118a and at least one predetermined reserved region 118b according to the arrangement of the corresponding through portions 116. In this embodiment, as shown in the top view of FIG. 1A, each of the rigid substrates 110 comprises two predetermined removed regions 118a and three predetermined reserved regions 118b. In this embodiment, in each of the rigid substrates 110, each of the predetermined removed regions 118a are disposed between the predetermined reserved regions 118b adjacent to the predetermined removed regions 118a. In this embodiment, the through portions 116 of the upper rigid substrate 110 are substantially corresponding to the through portions 116 of the lower rigid substrate 110.

Figure 2:
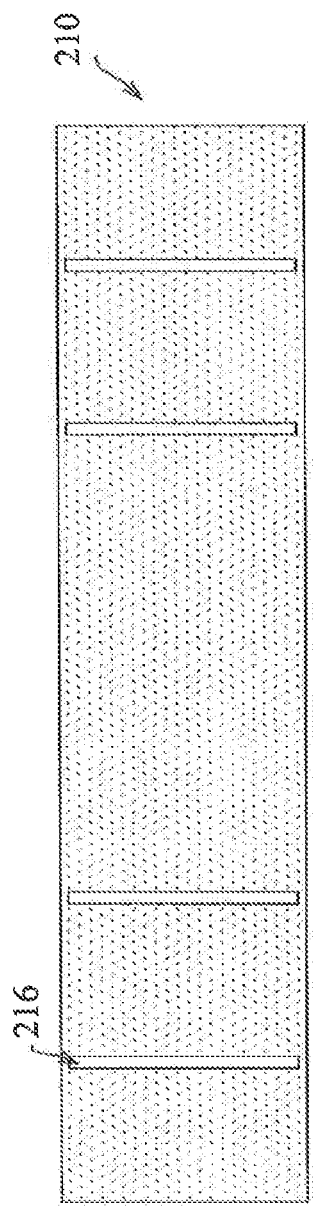
FIG. 2 is a top schematic view of a rigid substrate according to another embodiment of the present invention.

It should be noted that the shape of each of the through portions 116 could be changed according to different requirements. FIG. 2 is a top schematic view of a rigid substrate according to another embodiment of the present invention. Referring to FIG. 2, in this embodiment, each of the through portions 216 of the rigid substrate 210 is rectangular with relatively long and narrow shape. Therefore, the aforesaid shapes of the through portions 116 and 216 in the above embodiments are illustrative rather than restrictive to the present invention.

Figure 1B:
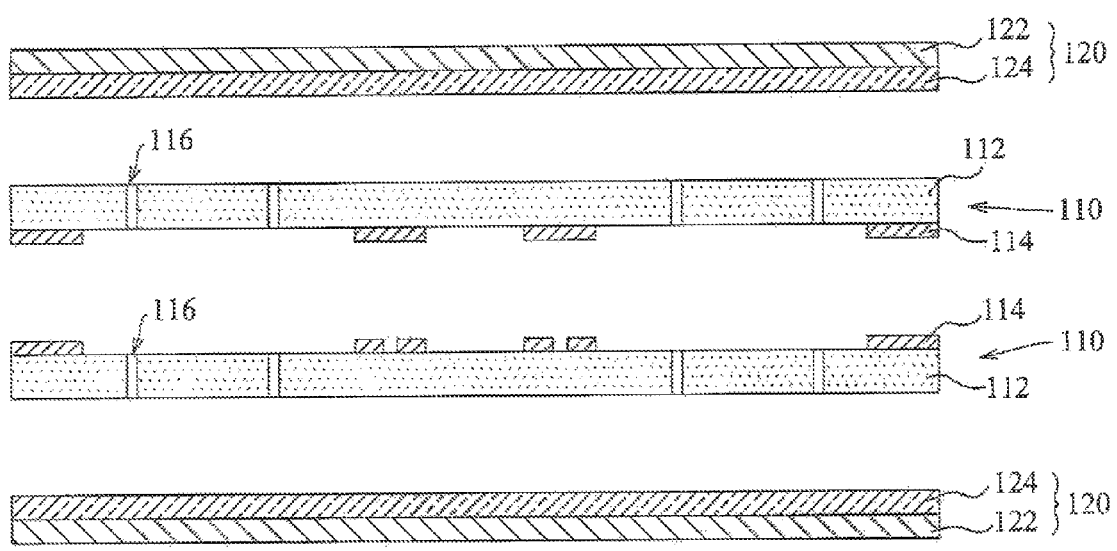

Referring to FIG. 1B, at least one conductive bonding layer 120 is provided. In this embodiment, for example, two conductive bonding layers 120 are provided. Each of the conductive bonding layers 120 comprises a conductive layer 122 and a dielectric bonding layer 124 disposed on the conductive layer 122. In this embodiment, for example, each of the conductive bonding layers 120 is a resin-coated copper; that is to say, for example, the conductive layer 122 of each of the conductive bonding layers 120 is a copper foil layer of a resin-coated copper, and the dielectric bonding layer 124 of each of the conductive bonding layers 120 is a resin layer of the resin-coated copper.

Figure 1C:
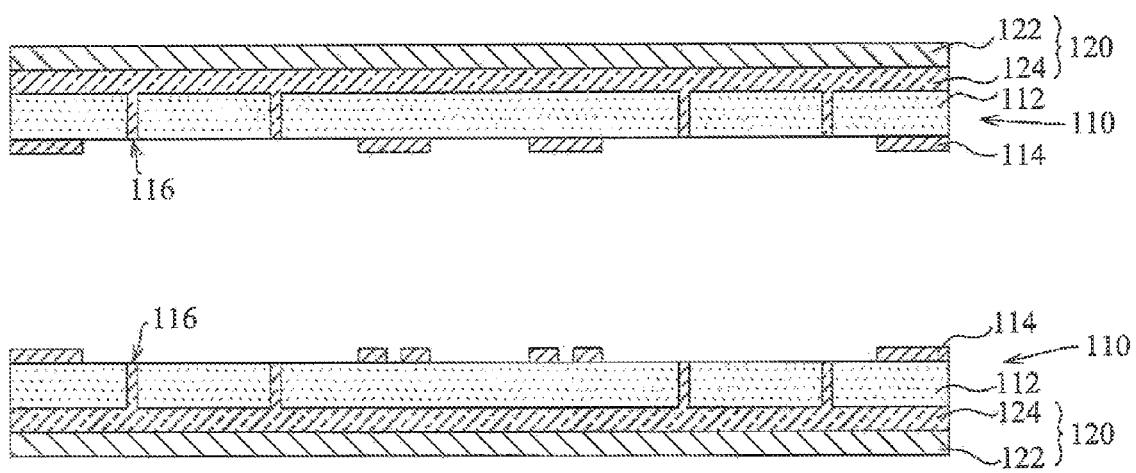

Referring to FIG. 1C, the conductive bonding layers 120 are laminated on the rigid substrates 110, respectively such that a portion of the dielectric bonding layer 124 of each of the conductive bonding layers 120 is disposed between the corresponding conductive layer 122 and the corresponding rigid substrate 110, and another portion of the dielectric bonding layer 124 of each of the conductive bonding layers 120 fills the through portions 116 of the corresponding rigid substrate 110.

Figure 1D:
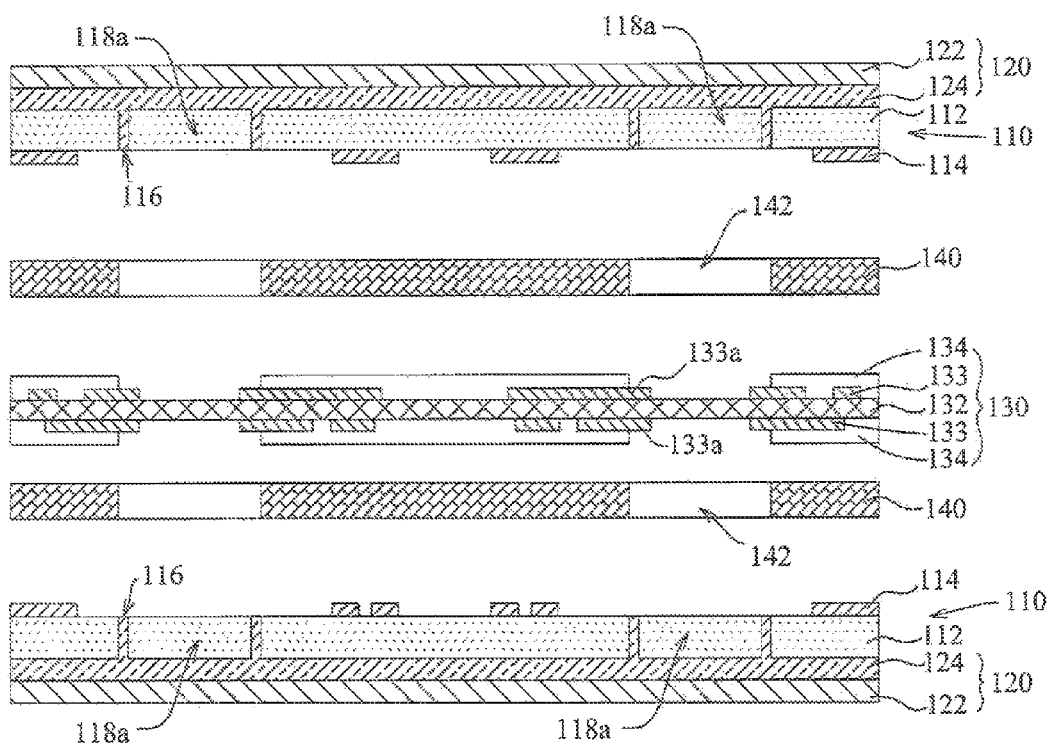

Referring to FIG. 1D, a flexible circuit board 130 and at least one bonding sheet 140 are provided. In this embodiment, for example, two bonding sheets 140 are provided. For example, in point of character, each of the bonding sheets 140 can be a non-flowing prepreg or a low-flow prepreg; however, in point of material, each of the bonding sheets 140 can be a resin prepreg. Each of the bonding sheets 140 has at least one through region 142. For example, in each of the bonding sheets 140, there are two through regions 142 schematically shown in FIG. 1D. The size of each of the through regions 142 is roughly equal to the area of the corresponding predetermined removed region 118a.

For example, the flexible circuit board 130 comprises a flexible dielectric layer 132, two circuit layers 133, and two flexible cover layers 134. The circuit layers 133 are disposed on two opposite sides of the flexible dielectric layer 132, respectively. The flexible cover layers 134 are disposed on two opposite sides of the flexible dielectric layer 132, respectively and partially cover the circuit layers 133, respectively. A portion of the circuit layer 133 disposed above the flexible dielectric layer 132 is exposed outside the flexible cover layer 134 disposed above the flexible dielectric layer 132, and a plurality of golden finger contacts 133a is formed. A portion of the circuit layer 133 disposed below the flexible dielectric layer 132 is exposed outside the flexible cover layer 134 disposed below the flexible dielectric layer 132, and a plurality of another golden finger contacts 133a is formed. It should be noted that, in another embodiment, one of the flexible cover layers 134 could cover the corresponding circuit layer 133 completely according to the manufacturer's requirement.

In addition, in this embodiment, for example, the material of each of the flexible dielectric layers 132 is polyimide (PI) resin or epoxy resin, and the material of each of the flexible cover layers 134 is polyimide (PI) resin together with epoxy resin or another material.

Figure 1E:
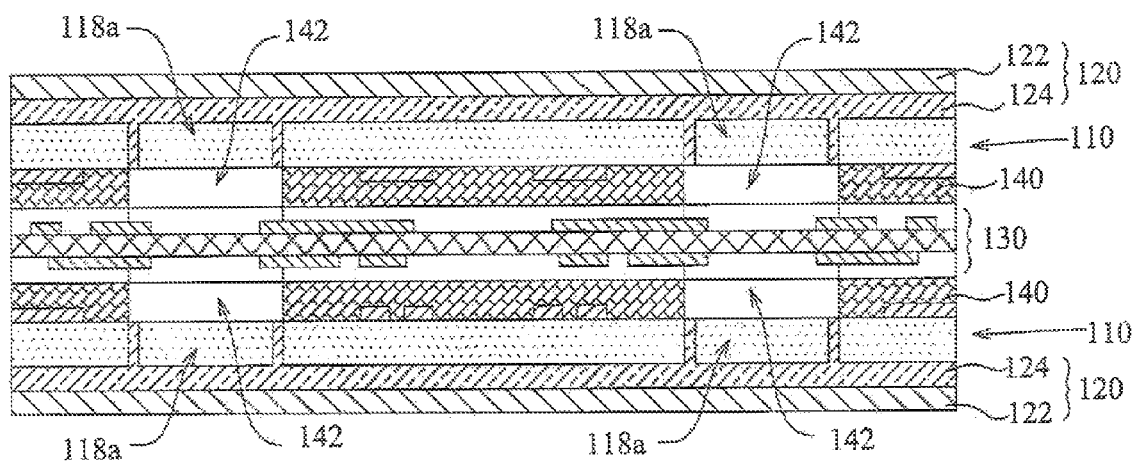

Referring to FIG. 1E, for example, the flexible circuit board 130 and the rigid substrates 110 are laminated together by means of the bonding sheets 140 such that each of the bonding sheets 140 is bonded to the flexible circuit board 130 and the corresponding rigid substrate 110 and located between the flexible circuit board 130 and the corresponding rigid substrate 110. The flexible circuit board 130 and the conductive layer 122 of the upper conductive bonding layers 120 are disposed on two opposite sides of the upper rigid substrate 110, respectively. The flexible circuit board 130 and the conductive layer 122 of the lower conductive bonding layers 120 are disposed on two opposite sides of the lower rigid substrates 110, respectively. Furthermore, the through regions 142 of the upper bonding sheet 140 are corresponding to the predetermined removed regions 118a of the upper rigid substrate 110, respectively. The through regions 142 of the lower bonding sheet 140 are corresponding to the predetermined removed regions 118a of the lower rigid substrate 110, respectively.

Figure 1F:
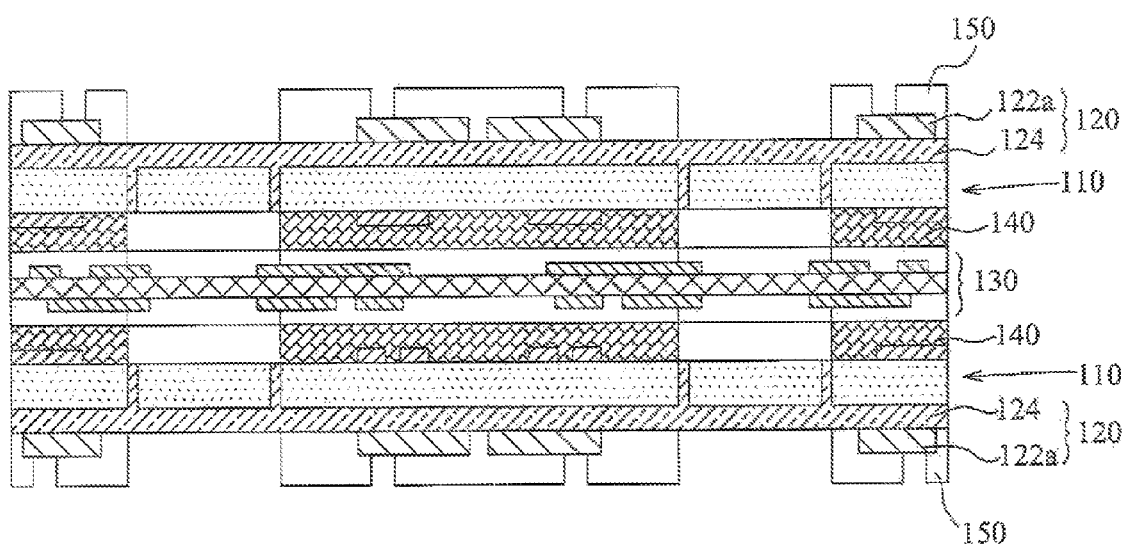
Figure 1G:
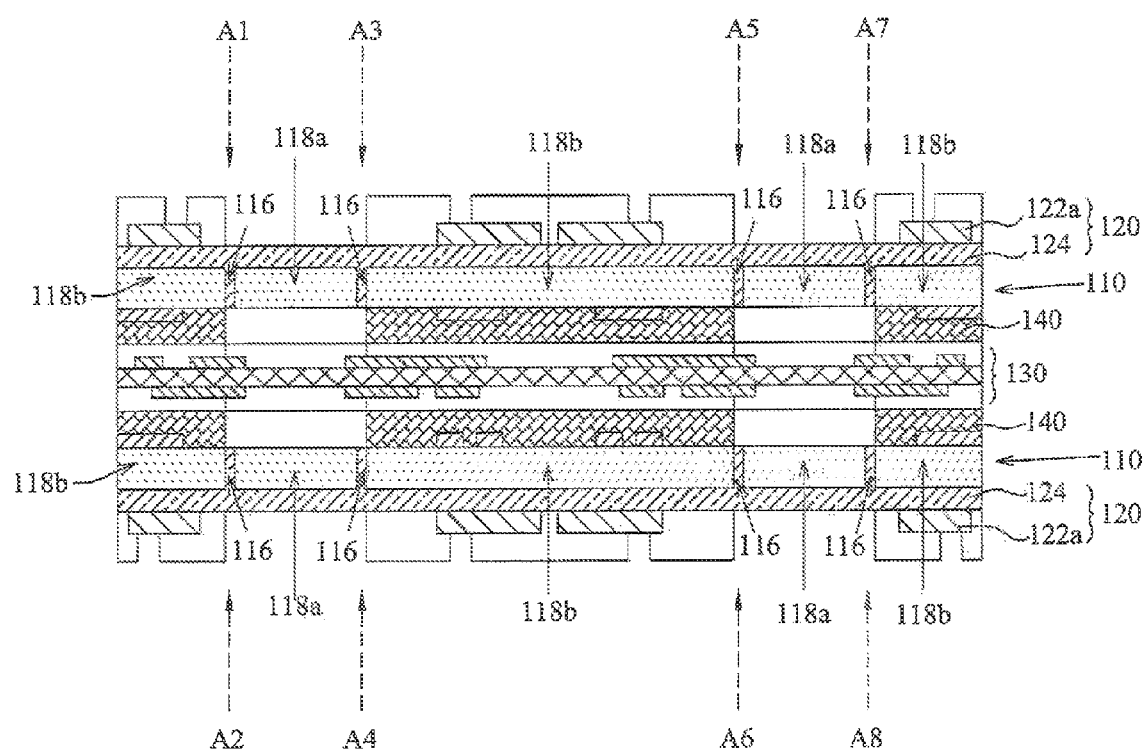

Referring to FIG. 1F, the conductive layers 122 of the conductive bonding layers 120 are patterned through the microlithographic process and the etching process to form a plurality of circuit layers 122a. Then, a solder mask layer 150 is formed on the dielectric bonding layer 124 of each of the conductive bonding layers 120 so as to cover at least a portion of the corresponding circuit layer 122a.

Referring to FIG. 1a the rigid substrates 110, the flexible circuit board 130, and the conductive bonding layers 120 are bent according to the through portions 116. Specifically speaking, in the upper rigid substrate 110, the left predetermined reserved region 118b is bent relatively to the predetermined removed region 118a adjacent to the left predetermined reserved region 118b and bent at the through portions 116 which are indicated by an arrow of a dotted line A1 and located between the left predetermined reserved region 118b and the adjacent predetermined removed region 118a. In the lower rigid substrate 110, the left predetermined reserved region 118b is bent relatively to the predetermined removed region 118a adjacent to the left predetermined reserved region 118b and bent at the through portions 116 which are indicated by an arrow of a dotted line A2 and located between the left predetermined reserved region 118b and the adjacent predetermined removed region 118a. To sum up, the left predetermined reserved regions 118b are bent upward and downward relative to the adjacent predetermined removed regions 118a according to the through portions 116 indicated by the arrows of the dotted lines A1 and A2.

In the upper rigid substrate 110, the middle predetermined reserved region 118b is bent relative to the left predetermined removed region 118a adjacent to the middle predetermined reserved region 118b and bent at the through portions 116 which are indicated by an arrow of a dotted line A3 and located between the middle predetermined reserved region 118b and the adjacent left predetermined removed region 118a. In the lower rigid substrate 110, the middle predetermined reserved region 118b is bent relative to the left predetermined removed region 118a adjacent to the middle predetermined reserved region 118b and bent at the through portions 116 which are indicated by an arrow of a dotted line A4 and located between the middle predetermined reserved region 118b and the adjacent left predetermined removed region 118a. To sum up, the middle predetermined reserved regions 118b are bent upward and downward relative to the adjacent left predetermined removed regions 118a according to the through portions 116 indicated by the arrows of the dotted lines A3 and A4.

In the upper rigid substrate 110, the middle predetermined reserved region 118b is bent relative to the right predetermined removed region 118a adjacent to the middle predetermined reserved region 118b and bent at the through portions 116 which are indicated by an arrow of a dotted line A5 and located between the middle predetermined reserved region 118b and the adjacent right predetermined removed region 118a. In the lower rigid substrate 110, the middle predetermined reserved region 118b is bent relative to the right predetermined removed region 118a adjacent to the middle predetermined reserved region 118b and bent at the through portions 116 which are indicated by an arrow of a dotted line A6 and located between the middle predetermined reserved region 118b and the adjacent right predetermined removed region 118a. To sum up, the middle predetermined reserved regions 118b are bent upward and downward relative to the adjacent right predetermined removed regions 118a according to the through portions 116 indicated by the arrows of the dotted lines A5 and A6.

In the upper rigid substrate 110, the right predetermined reserved region 118b is bent relative to the predetermined removed region 118a adjacent to the right predetermined reserved region 118b and bent at the through portions 116 which are indicated by an arrow of a dotted line A7 and located between the right predetermined reserved region 118b and the adjacent predetermined removed region 118a. In the lower rigid substrate 110, the right predetermined reserved region 118b is bent relative to the predetermined removed region 118a adjacent to the right predetermined reserved region 118b and bent at the through portions 116 which are indicated by an arrow of a dotted line A8 and located between the right predetermined reserved region 118b and the adjacent predetermined removed region 118a. To sum up, the right predetermined reserved regions 118b are bent upward and downward relative to the adjacent predetermined removed regions 118a according to the through portions 116 indicated by the arrows of the dotted lines A7 and A8.

Since the material of the dielectric bonding layer 124 that tills the through portions 116 is more brittle than that of the rigid substrates 110, cracks occur inside the corresponding through portions 116 as a result of the aforesaid bending step and extend to penetrate the dielectric bonding layers 124 outside.

Figure 1H:
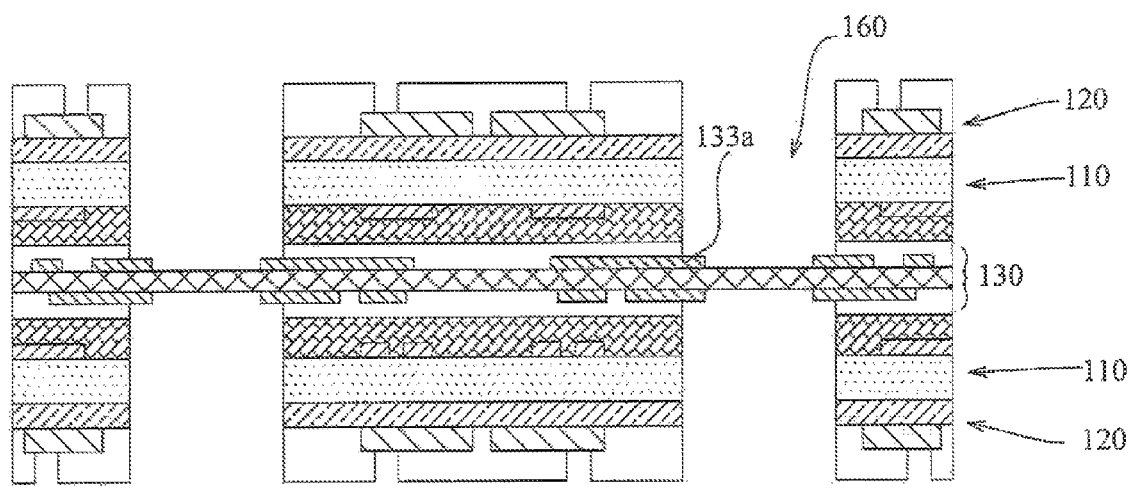
Figure 11:
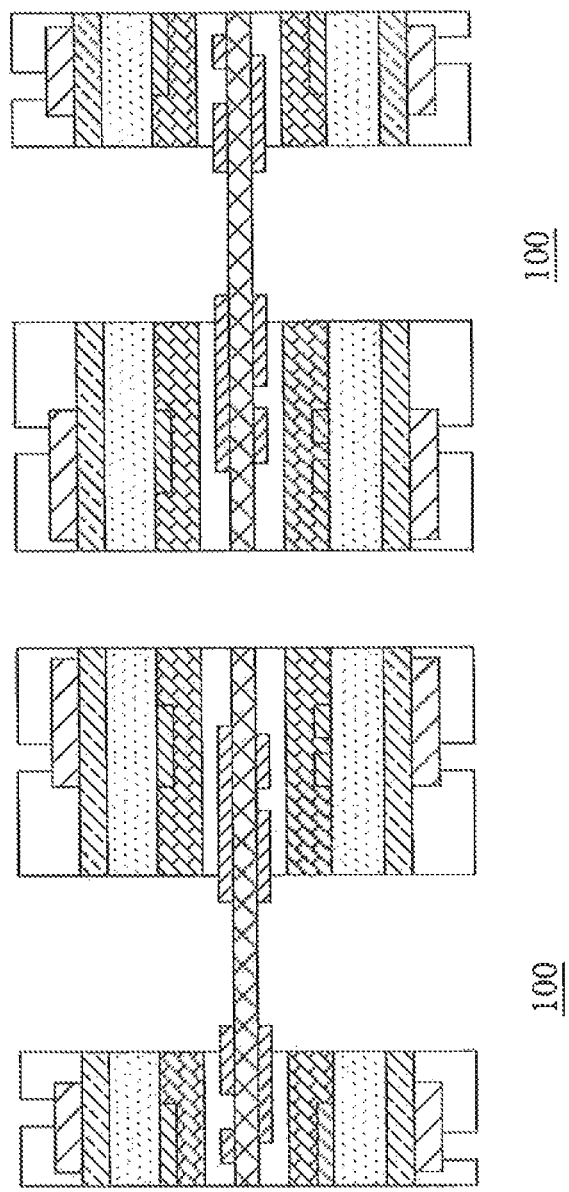

Referring to FIG. 1H, a portion of the rigid substrates 110 located at the predetermined removed regions 118a (shown in FIG. 1G) and a portion of the conductive bonding layers 120 corresponding to the predetermined removed regions 118a (shown in FIG. 1G) are removed to form a plurality of indentations 160 so as to expose a portion of the flexible circuit board 130. In this embodiment, the golden finger contacts 133a of the flexible circuit board 130 are exposed outside by the indentations 160.

Finally, referring to FIG. 1I, a singulating process is performed to form a plurality of combined circuit boards 100. It should be noted that the singulating process involves cutting the structure shown in FIG. 1H according to requirement, so as to form the combined circuit boards 100 of required dimensions.

The method of manufacturing a combined circuit board according to the present invention at least has one of the following advantages or other advantages:

1. In the present invention, the rigid substrate, the flexible circuit hoard, and the conductive bonding layer are bent according to the through portions filled with the dielectric bonding layer, and a portion of the rigid substrate located at the predetermined removed region and a portion of the conductive bonding layer corresponding to the predetermined removed region are removed to form the indentation.

Therefore, in the method of manufacturing a combined circuit board according to the present invention, any unanticipated damage to the flexible circuit board can be prevented during the formation of the indentation. Accordingly, the yield of manufacturing the combined circuit board by means of the method of the present invention is relatively high.

2. in the method of manufacturing a combined circuit hoard according to the present invention, prior to the formation of the indentation, the conductive layer of the conductive bonding layer is patterned to form the circuit layer and the solder mask layer for protecting the circuit layer is formed, so the indentation formed alter does not affect the patterning process and the formation of the solder mask layer.

The foregoing preferred embodiments are provided to illustrate and disclose the technical features of the present invention, and are not intended to he restrictive of the scope of the present invention. Hence, all equivalent variations or modifications made to the foregoing embodiments without departing from the spirit embodied in the disclosure of the present invention should fall within the scope of the present invention as set forth in the appended claims.

The invention claimed is:

1. A method of manufacturing a combined circuit board comprising:
   providing a rigid substrate comprising a rigid dielectric layer;
   forming a plurality of through portions in the rigid dielectric layer, wherein the through portions are arranged in a predetermined format and pass through the rigid dielectric layer such that the rigid substrate is divided into at least one predetermined removed region and at least one predetermined reserved region according to the arrangement of the through portions;
   providing a conductive bonding layer comprising a conductive layer and a dielectric bonding layer disposed on the conductive layer;
   laminating the conductive bonding layer on the rigid substrate such that a portion of the dielectric bonding layer is disposed between the conductive layer and the rigid substrate, and another portion of the dielectric bonding layer fills the through portions;
   laminating a flexible circuit board on the rigid substrate such that the flexible circuit board and the conductive layer are disposed on two opposite sides of the rigid substrate, respectively;
   patterning the conductive layer to form a circuit layer;
   bending the rigid substrate, the flexible circuit board, and the conductive bonding layer according to the through portions such that the at least one predetermined reserved region is bent at the through portions relatively to the at least one predetermined removed region; and
   removing a portion of the rigid substrate located at the at least one predetermined removed region and a portion of the conductive bonding layer corresponding to the at least one predetermined removed region to form an indentation to expose a portion of the flexible circuit board.

2. The method as claimed in claim 1, further comprising forming a solder mask layer at least partially covering the circuit layer before bending the rigid substrate, the flexible circuit board, and the conductive bonding layer.

3. The method as claimed in claim 1, wherein the step of laminating the flexible circuit board on the rigid substrate is performed by laminating the flexible circuit board on the rigid substrate by means of a bonding sheet such that the bonding sheet is bonded to the flexible circuit board and the rigid substrate and located between the flexible circuit board and the rigid substrate, and the bonding sheet has at least one through region corresponding to the at least one predetermined removed region.

4. The method as claimed in claim 1, wherein the through portions are formed through laser processing.

5. The method as claimed in claim 1, wherein the through portions are formed through punching or drilling.

6. The method as claimed in claim 1, wherein the conductive bonding layer is a resin-coated copper.

7. The method as claimed in claim 1, wherein the material of the rigid dielectric layer comprises fiberglass and resin.

* * * * *